United States Patent
Kim et al.

(10) Patent No.: US 7,652,497 B2
(45) Date of Patent: *Jan. 26, 2010

(54) SEQUENTIAL SEMICONDUCTOR DEVICE TESTER

(75) Inventors: Sun Whan Kim, Yongin-si (KR); Sang Sig Lee, Yongin-si (KR)

(73) Assignee: Unitest Inc., Yongin-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/976,864

(22) Filed: Oct. 29, 2007

(65) Prior Publication Data

US 2008/0197871 A1    Aug. 21, 2008

(30) Foreign Application Priority Data

Nov. 1, 2006    (KR) .................. 10-2006-0107110

(51) Int. Cl.
*G01R 31/26* (2006.01)
*G01R 31/28* (2006.01)

(52) U.S. Cl. .................. 324/765; 324/73.1; 714/724; 714/738

(58) Field of Classification Search .......... 324/765, 324/158.1, 73.1; 714/724, 729, 738
See application file for complete search history.

(56) References Cited

U.S. PATENT DOCUMENTS

| 5,235,271 | A | * | 8/1993 | Kira | 324/765 |
| 6,028,439 | A | * | 2/2000 | Arkin et al. | 324/765 |
| 6,202,186 | B1 | * | 3/2001 | Oonk | 714/738 |
| 6,351,834 | B1 | * | 2/2002 | Maekawa et al. | 714/718 |
| 6,779,140 | B2 | * | 8/2004 | Krech et al. | 714/718 |
| 7,065,693 | B2 | * | 6/2006 | Konuk | 714/738 |
| 7,272,765 | B2 | * | 9/2007 | Ichiyoshi | 714/742 |
| 7,420,385 | B2 | * | 9/2008 | Hubscher et al. | 324/765 |
| 2002/0089341 | A1 | * | 7/2002 | Hubner et al. | 324/754 |
| 2002/0186003 | A1 | * | 12/2002 | Ebiya | 324/158.1 |

* cited by examiner

*Primary Examiner*—Ha Tran T Nguyen
*Assistant Examiner*—Karen M Kusumakar
(74) *Attorney, Agent, or Firm*—The Nath Law Group; Jerald L. Meyer; Sungyeop Chung

(57) ABSTRACT

A sequential semiconductor device tester, and in particular to a sequential semiconductor device tester is disclosed. In accordance with the sequential semiconductor device tester, a function of generating a test pattern data for a test of a semiconductor device and a function of carrying out the test are separated to sequentially test the semiconductor device, to maintain a signal integrity and to improve an efficiency of the test by carrying out a test under an application environment or an ATE test according to the test pattern data.

14 Claims, 7 Drawing Sheets

SEQUENTIAL SEMICONDUCTOR DEVICE TESTER

BACKGROUND OF THE INVENTION

1. Field of the Invention

The present invention relates to a sequential semiconductor device tester, and in particular to a sequential semiconductor device tester wherein a function of generating a test pattern data for a test of a semiconductor device and a function of carrying out the test are separated to sequentially test the semiconductor device, to maintain a signal integrity and to improve an efficiency of the test by carrying out a test under an application environment or an ATE test according to the test pattern data.

2. Description of the Related Art

A tester for testing a semiconductor device tests whether the semiconductor device is defective. The tester for testing the semiconductor device is designed and developed according to a development state of a memory device, a DRAM in particular which takes up most of the memory devices since the tester for testing the semiconductor device is mostly used for testing the memory devices.

The development of the DRAM is progressing from an EDO (Extended Data Output) DRAM, SDRAM (Synchronous DRAM), Rambus DRAM to DDR (Double Data Rate) DRAM.

In order to test the DRAM, a high speed and a high accuracy are required for the tester so as to correspond to a high speed DRAM. In addition, as a capacity of the memory is increased, a time required for testing the DRAM also increases. Therefore, a testing speed is also required to be increased. Moreover, a cost for testing the memory should be reduced by embodying a miniaturized and economical tester.

Of the tester for testing the semiconductor device, the memory tester in particular is typically used for testing and verifying a memory component or a memory module in a form of a SIMM or DIMM. The tester detects a functional defect of the memory module or the memory component prior to an installation thereof in a real computer system.

The tester is classified into a hardware semiconductor device tester and a software diagnostic program executed in a PC environment. However, since the software diagnostic program diagnoses a state of the memory when the memory module or the memory component is installed in the real computer, the hardware semiconductor device tester is mainly used during a semiconductor memory manufacturing process.

The tester may be classified as a high-end tester referred to as an ATE (Automatic Test Equipment), a medium range memory tester and a low-end memory tester.

The ATE which is the high-end tester is typically used in order to carry out a test process of the memory device. The conventional ATE carries out tests such as a DC test for testing whether a DC parameter is suitable for a digital operation of a circuit, a transmission delay time of signals, and an AC margin related to a set-up time and a hold time. The ATE also generates a test pattern and a timing for the test. However, a manufacturing cost of the ATE is high since the ATE is manufactured using a dedicated equipment such as a main frame having a large size and a high price.

FIG. 1 is a block diagram illustrating a conventional semiconductor device tester.

As shown in FIG. 1, the conventional tester 100 comprises a pattern generator 110, a timing generator 120, a format controller 130, a driver 140, a comparator 150, and a test result storage 160. In addition to these components, the conventional tester may comprise a power supply controller for the DC test, a component for generating a clock signal, a component for supplying a power for an operation of a DUT (Device Under Test) 180, a component for relaying a test pattern data to the DUT 180 and receiving a test result from the DUT 180, a component for receiving a test pattern program from an outside, and a component for transmitting the test result to the outside. However, a description thereof is omitted.

The pattern generator 110 generates the test pattern data required for testing the DUT 180 based on the test pattern program. For instance, the test pattern program is written to include an instruction for carrying out various operations in order to carry out the test. The pattern generator 110 generates the test pattern data by receiving and interpreting the test pattern program from an external storage for instance. The test pattern data includes a data such as a command, address and a data inputted to the DUT 180. In addition, an expected data corresponding to the generated test pattern data is generated.

The timing generator 120 generates a timing edge which is a reference for converting the test pattern data generated in the pattern generator 110 into various waveforms. The timing edge is generated using a plurality of clocks for a smooth conversion.

The format controller 130 converts the test pattern data to a desired waveform based on the timing edge.

The driver 140 transmits the converted test waveform to the DUT 180.

The comparator 150 tests the DUT 180 by comparing the test output data being outputted from the DUT 180 after an operation of the DUT 180 is complete by the test waveform applied to the DUT 180 with the expected data generated in the pattern generator 110.

The test result storage 160 stores a test result based on a result of the comparison of the comparator 150. For instance, an information on a defective DUT is stored.

As described above, the conventional ATE is very highly priced. Therefore, it is preferable that a manufacturer designs the highly priced ATE efficiently in order to increase a competitiveness by minimizing a manufacturing cost thereof. For the efficient design of the ATE, the generation of the test pattern and the timing should be optimized.

Moreover, since the conventional ATE is very highly priced, a tester for testing the semiconductor device under an actual environment, i.e. an application environment tester may be used instead of the ATE.

For instance, Korean Patent Application No. 10-2002-0004428 filed on Jan. 25, 2002 by Silicontech titled "SEMICONDUCTOR MEMORY TESTER" discloses the application environment tester. In addition, Korean Patent Application No. 10-2004-78152 filed on Oct. 1, 2004 by the Applicant titled "SOCKET INTERFACE FOR APPLICATION TEST OF SEMICONDUCTOR DEVICE" wherein the test is carried out using an electronic device such as a hard disk drive, a graphic board and a DVD drive instead of a PC mainboard, and Korean Patent Application No. 10-2004-78153 filed on Oct. 1, 2004 by the Applicant titled "TEST FIXTURE FOR APPLICATION TEST AND SEMICONDUCTOR DEVICE APPLICATION TESTER HAVING THEREOF" disclose the application environment tester.

The application environment tester overcomes problems of the ATE that a long time is required for the test and that a detection of a defectiveness is limited under an application environment. Therefore, the application environment tester may carry out the test under the application environment using various diagnostic program such that the application environment tester is used for testing a new product or a product of a mass production.

Manufacturers of the semiconductor device uses both the ATE and the application environment tester are used to carry out the test.

Because basic principles employed by the ATE and the application environment tester are different, it is difficult to embody the ATE and the application environment tester simultaneously. Moreover, the application environment tester cannot test multiple semiconductor devices simultaneously.

In case of the ATE, because the number of semiconductors that may be tested using the pattern generator 110 shown in FIG. 1 is limited, a plurality of the pattern generators 110 should be used to test the multiple semiconductor devices in the ATE.

SUMMARY OF THE INVENTION

It is an object of the present invention to provide a sequential semiconductor device tester wherein a function of generating a test pattern data for a test of a semiconductor device and a function of carrying out the test are separated to sequentially test the semiconductor device, to maintain a signal integrity and to improve an efficiency of the test by carrying out a test under an application environment or an ATE test according to the test pattern data.

In order to achieve above-described object of the present invention, there is provided a sequential semiconductor device tester comprising: a test pattern generating module for generating a test pattern data; and a set of m test execution modules including first through $m^{th}$ test execution modules connected in series, wherein the test pattern data is received by the first test execution module from test pattern generating module and the test pattern data is then sequentially relayed to the second through $m^{th}$ test execution modules connected in series to test a DUT and generate a test result data for the DUT.

It is preferable that the test pattern generating module comprises: a test pattern data generator for generating the test pattern data; and a test pattern generating module communication interface for transmitting the test pattern data to the first test execution module and for receiving the test result data from each of the set of m test execution modules.

It is preferable that the each of the set of m test execution modules comprises: a test execution module communication interface for transceiving the test pattern data and the test result data; and a test execution unit for applying the test pattern data received through the test execution module communication interface to the DUT and receiving an output of the DUT corresponding to the test pattern data from the DUT to generate the test result data.

It is preferable that the test pattern generating module or the first through $m^{th}$ test execution modules transmits the test result data to an external apparatus.

It is preferable that the test pattern data or the test result data comprises a control data for controlling each of the first through $m^{th}$ test execution modules.

It is preferable that the control data comprises an identification information of each of the first through $m^{th}$ test execution modules.

It is preferable that each of the first through $m^{th}$ test execution modules relays the test pattern data and the test result data to other test execution modules based on the identification information except for the test pattern data or the test result data designated thereto.

It is preferable that the test pattern generating module communication interface receives a test pattern program for generating the test pattern data from an external apparatus.

It is preferable that the test pattern generating module communication interface receives a test pattern of an application environment for generating the test pattern data from an external apparatus, and wherein the test pattern data generator generates the test pattern data based on the test pattern of the application environment.

It is preferable that the test pattern data generator generates the test pattern data based on a test pattern of an application environment stored therein.

It is preferable that the test pattern generating module further comprises a synchronization buffer for transceiving the test pattern data and the test result data with a plurality of the first test execution modules synchronously.

It is preferable that the test pattern data comprises a control command for testing the DUT, a clock signal, a write data to be written to the DUT and an expected data for the test result data.

It is preferable that each of the set of m test execution modules comprises a test execution unit for applying the test pattern data to the DUT and receiving an output of the DUT corresponding to the test pattern data from the DUT to generate the test result data, the test execution unit comprising: a clock generator for generating a synchronous clock based on the clock signal; a control command interpreter for interpreting the control command based on the synchronous clock to be applied to the DUT; a driver for applying the write data to the DUT based on the control command and the synchronous clock; a comparator for comparing the test result data to the expected data to determine a defectiveness of the DUT; and a test result storage for storing a result of the determination of the comparator.

It is preferable that the test pattern generating module is accommodated in a single test pattern generating board and the first and $m^{th}$ test execution modules are accommodated in a single test execution board, the single test pattern generating board and the single test execution board are connected to each other via a connector.

It is preferable that the test pattern generating module is accommodated in a single test pattern generating board, the first through $m^{th}$ test execution modules are accommodated in a single test execution board, and the one or more DUT module is accommodated in a single DUT board or a plurality of DUT boards, a number of the plurality of DUT boards corresponding to that of the DUT module, the single test pattern generating board and the single test execution board are connected to each other via a first connector, and the single test execution board and the DUT board are connected to each other via a second connector corresponding to the test execution module and the DUT module.

DETAILED DESCRIPTION OF THE INVENTION

The present invention will now be described in detail with reference to the accompanied drawings. The interpretations of the terms and wordings used in Description and Claims should not be limited to common or literal meanings. The embodiments of the present invention are provided to describe the present invention more thoroughly for those skilled in the art.

Figure 1:
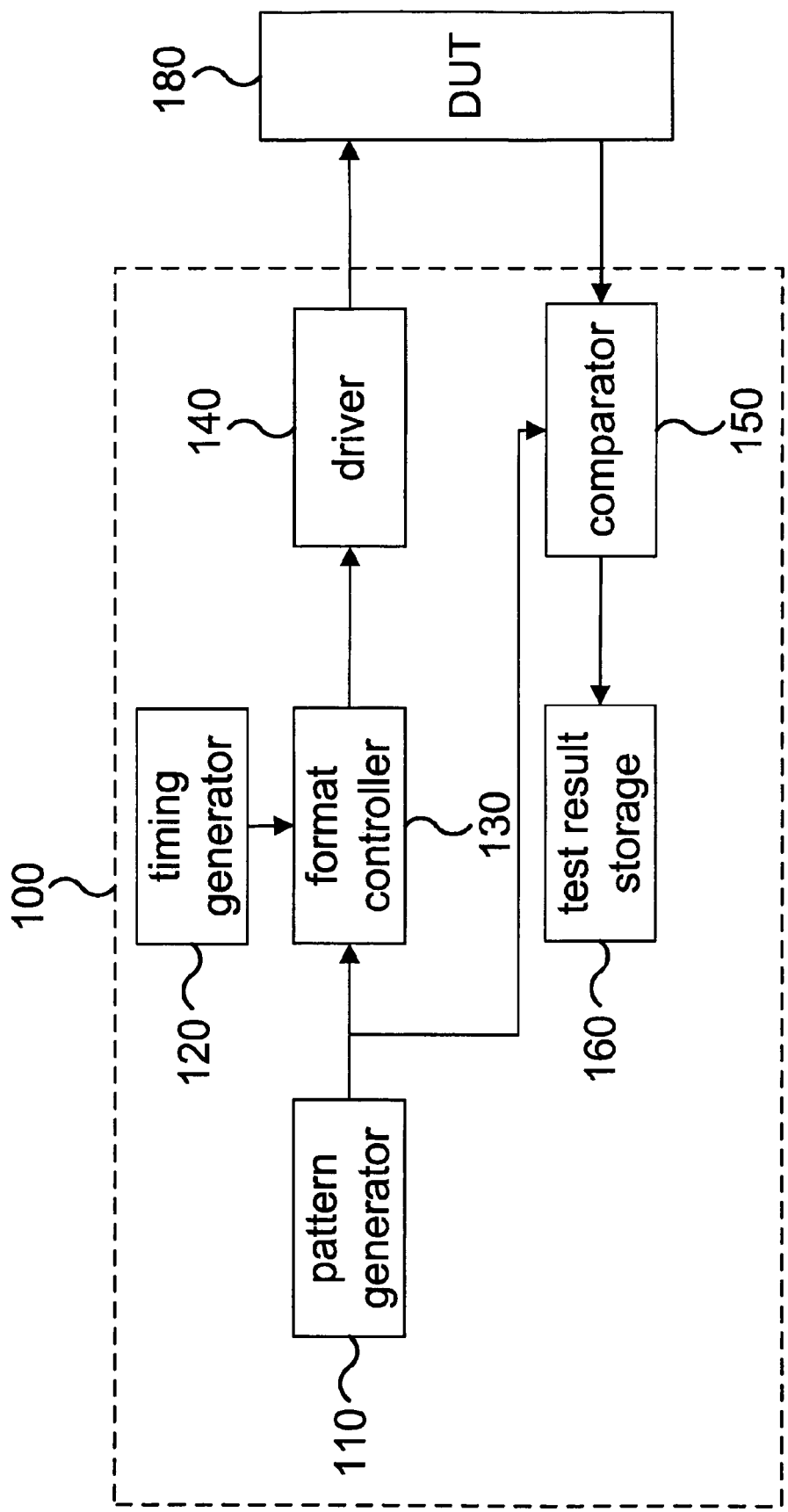
FIG. 1 is a block diagram illustrating a conventional semiconductor device tester.
Figure 2:
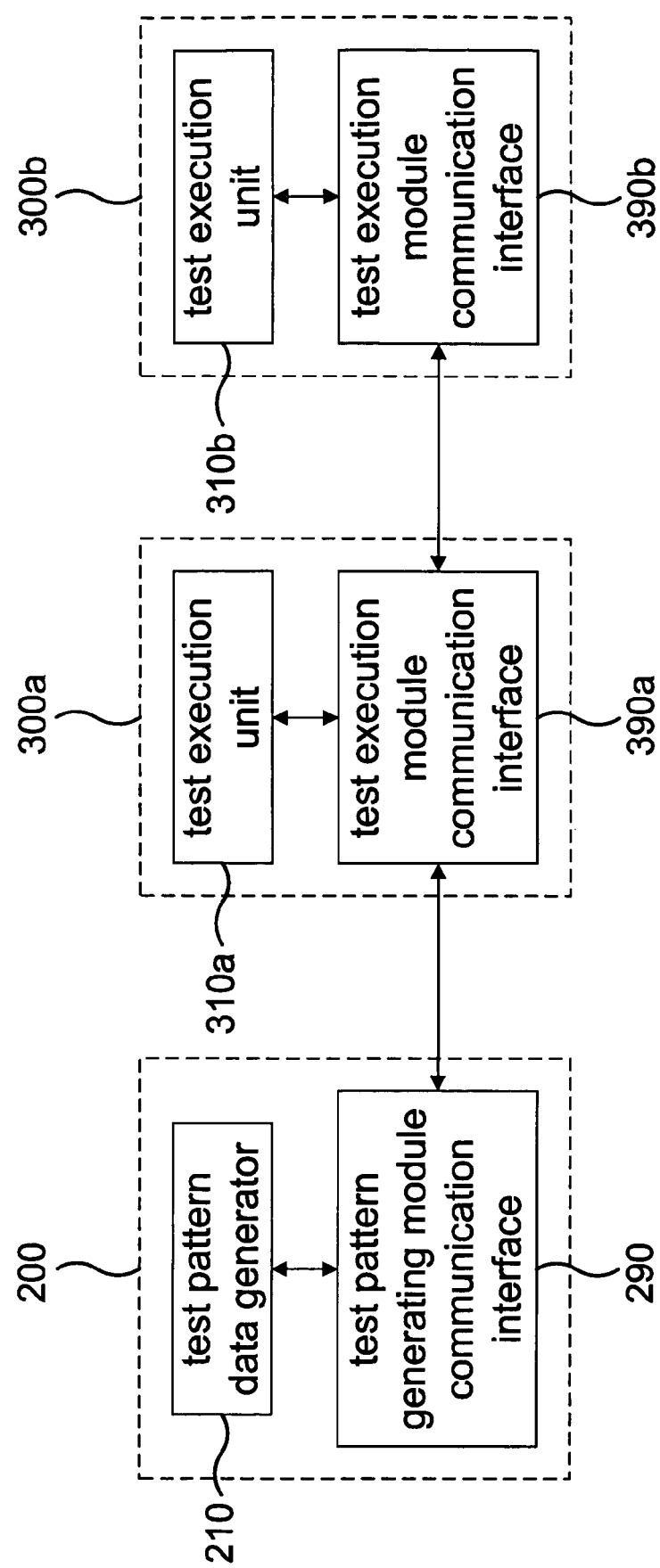
FIG. 2 is a block diagram exemplifying a sequential semiconductor device tester in accordance with the present invention.

FIG. 2 is a block diagram exemplifying a sequential semiconductor device tester in accordance with the present invention.

As shown in FIG. 2, the sequential semiconductor device tester comprises a test pattern generating module 200, test execution modules 300a and 300b. In addition, the test pattern generating module 200 comprises a test pattern data generator 210 and a test pattern generating module communication interface 290. The test execution modules 300a and 300b comprise test execution units 310a and 310b and test execution module communication interfaces 390a and 390b, respectively.

The test pattern generating module 200 generates a test pattern data for a semiconductor device to be tested, i.e. a DUT (Device Under Test).

The test pattern generating module 200 is described in detail below.

The test pattern data generator 210 generates the test pattern data.

The test pattern data may be generated by interpreting a test pattern program to generate the test pattern data similar to the conventional ATE.

The test pattern data may comprise a control command for testing the DUT, a clock signal, a write data to be written to the DUT and an expected data for a test result data.

The test pattern generating module communication interface 290 receives the test pattern program from an external apparatus (not shown), and the test pattern data generator 210 interprets the test pattern program to generate the test pattern data.

In addition, the test pattern data generator 210 may generate the test pattern data based on a test pattern of an application environment when an application environment test is to be carried out similar to a conventional base on the application environment tester.

When the application environment test is to be carried out, the test pattern data generator 210 stores the test pattern of the application environment therein in advance and generate the test pattern data based on the test pattern of the application environment. Alternately, the test pattern data generator 210 may generate the test pattern data after receiving the test pattern of the application environment from the external apparatus (not shown).

When a plurality of DUTs are tested using the conventional application environment tester, the semiconductor device such as a memory device is removed from a motherboard of an actual system for the application environment test of each of the plurality of DUTs, a socket for mounting the DUT is installed thereafter and the plurality of DUTs are then loaded and tested. However, in accordance with the present invention, the test pattern data generator 210 may generate the test pattern of the application environment to be transmitted to the plurality of DUTs. Therefore, the test pattern data generator 210 in accordance with the present invention is advantageous in that the actual system the number of which correspond to that of the DUT and the process of removing the semiconductor device, installing the socket are not required.

The test pattern generating module communication interface 290 transmits the test pattern data to the test execution modules 300a and 300b and receives the test result data from the test execution modules 300a and 300b.

The test pattern generating module communication interface 290 may include at least one of a signal wiring for transmitting the test pattern data to the test execution modules 300a and 300b, a signal wiring for receiving the test result data, a signal wiring for transceiving a control data and a controller for carrying out a communication through the signal wirings.

Since the sequential semiconductor device tester is intended to test the plurality of DUTs, the test pattern generating module 200 may further comprise a synchronization buffer (not shown) for transceiving the test pattern data or the test result data with the two or more test execution modules 300a and 300b synchronously.

The synchronization buffer may be used maintain a signal integrity between the test pattern generating module 200 the test execution modules when the test pattern generating module 200 is connected to the test execution modules in parallel in particular.

Each of the two or more test execution modules 300a and 300b receives the test pattern data to test the DUR and generates the test result data for the DUT.

The test execution modules 300a and 300b are described in detail below.

The test execution units 310a and 310b applies the test pattern data to the DUT and receives an output of the DUT corresponding to the test pattern data from the DUT to generate the test result data.

Figure 3:
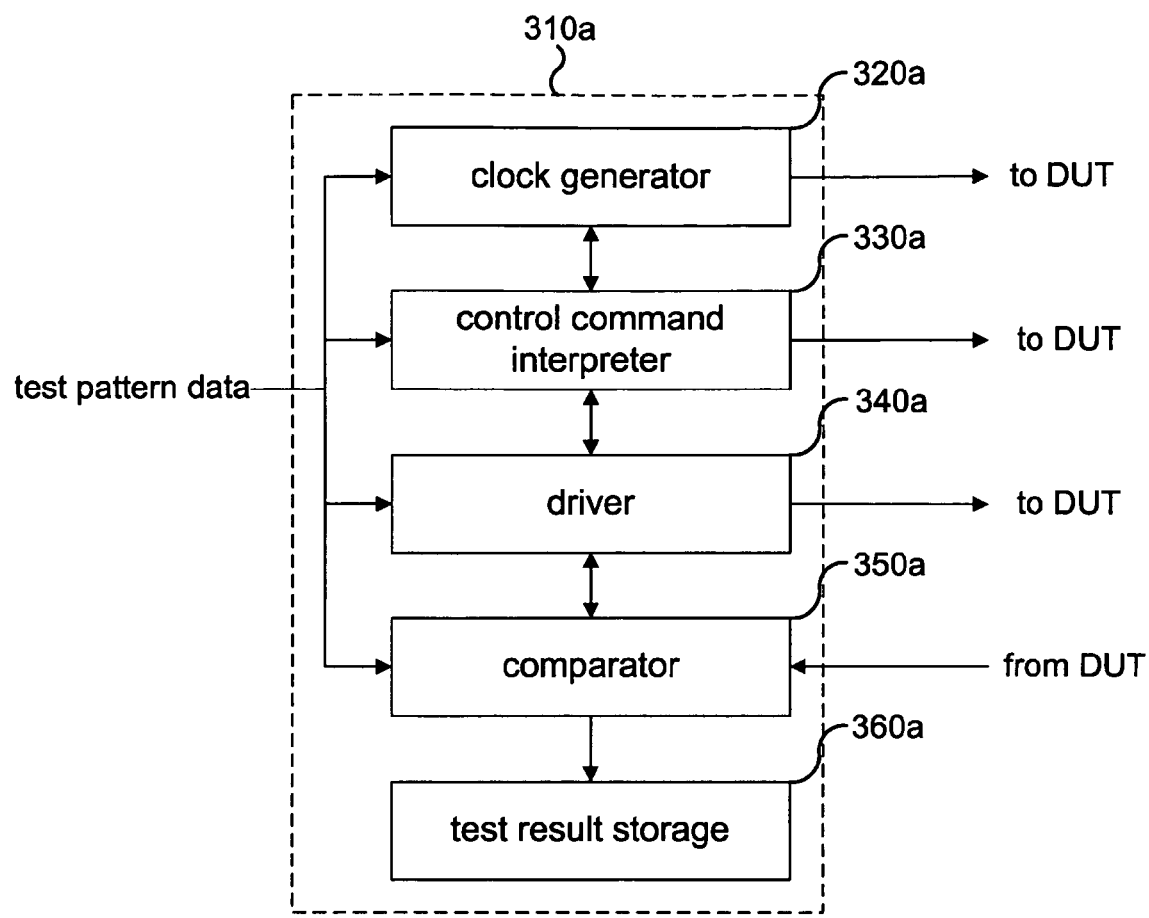
FIG. 3 is a block diagram exemplifying a test execution unit of a sequential semiconductor device tester in accordance with the present invention.

FIG. 3 is a block diagram exemplifying the test execution unit of the sequential semiconductor device tester in accordance with the present invention.

The test execution unit is described in detail below with reference to FIG. 3.

As described above, the test pattern data may comprise the control command for testing the DUT, the clock signal, the write data to be written to the DUT and the expected data for the test result data.

The test execution unit 310a interprets data included in the test pattern data and applies the write data to the DUT. The test execution unit 310a receives the output of the DUT and compares the test result data generated by the test execution modules with the expected data to determine whether the DUT is defective.

As shown in FIG. 3, the test execution unit 310a comprises a clock generator 320a, a control command interpreter 330a, a driver 340a, a comparator 350a and a test result storage 360a.

The clock generator 320a generates a synchronous clock based on the clock signal. The synchronous clock is a synchronous signal serving as a reference for an operation of the test execution unit 310a or an operation of the DUT. The clock generator 320a may be embodied using a PLL (Phase-Locked Loop)

The control command interpreter 330a interprets the control command based on the synchronous clock generated by the clock generator 320a to be applied to the DUT.

The driver 340a applies the write data to the DUT based on the synchronous clock of the clock generator 320a and the control command of the control command interpreter 330a.

The comparator 350a compares the test result data generated based on the output of the DUT to the expected data to determine whether the DUT is defective.

The test result storage 360a stores a result of the determination of the comparator 350a. Preferably, the test result storage 360a stores an information on the DUT determined to be defective such that the defective DUT may be removed.

Through above-described constitution, the test execution units 310a and 310b may generate the test result data.

The test execution module communication interfaces 390a and 390b provide an interface for transceiving the test pattern data or the test result data with the test pattern generating module 200 or other test execution modules. For instance, the test execution module communication interface 390a provides the interface for transceiving the test pattern data or the test result data with the test pattern generating module 200 or the test execution modules 390b.

That is, the test execution module communication interfaces 390a and 390b may include at least one of a signal wiring for receiving the test pattern data from the test pattern generating module 200, a signal wiring for transmitting the test result data, the signal wiring for transceiving the control data and the controller for carrying out the communication through the signal wirings.

Each of the test execution modules 300a and 300b receives the test pattern data from the test pattern generating module 200 or the other test execution modules 300b and 300a through the test execution module communication interfaces 390a and 390b.

That is, the test execution module 300a may receive the test pattern data from the test pattern generating module 200 to carry out the test and the test execution module 300b receives the test pattern data from the test execution module 300a to carry out the test as shown.

While two test execution modules 300a and 300b are shown in FIG. 2, two or more test execution modules may be included in the sequential semiconductor device tester in accordance with the present invention according to the number of the DUTs.

Each of the test execution modules 300a and 300b may further comprise a relay buffer (not shown) for relaying the test pattern data or the test result data with other test execution modules 300b and 300a or the test pattern generating module 200 synchronously. Particularly, the relay buffer may be used to maintain the signal integrity when the plurality of test execution modules are connected in a form of a chain.

That is, when the plurality of the test execution module are connected in a form of a daisy chain, the test execution modules 300a and 300b may comprise the relay buffer for relaying the test pattern data or the test result data between the test execution module at a first stage of the daisy chain and the test execution module at a stage later than the first stage.

The test execution modules 300a and 300b sequentially carry out the test based on the test pattern data. For instance, the test execution module 300a may carry out the test first and the test execution module 300b may then carry out the test.

The test result data generated by the test execution modules 300a and 300b after carrying out the test is preferably received by the test pattern generating module communication interface 290 of the test pattern generating module 200. Thereafter, the test pattern generating module communication interface 290 transmits the test result data to the external apparatus so that a user may check a result of the test through the external apparatus.

However, the test execution module communication interface 390a or 390b may directly transmit the test result data to the external apparatus so that the user may check the result of the test through the external apparatus.

The transmission of the test result data or the test pattern data may be carried out when the test execution module communication interface 390a or 390b or the test pattern generating module communication interface 290 is idle.

The test pattern data or the test result data tranceived through the test pattern generating module communication interface 290 or the test execution module communication interface 390b may include a control data for controlling each of the test execution modules 300a and 300b.

The control data may include an identification information of the test execution modules 300a and 300b. Each of the test execution modules 300a and 300b may receive the test pattern data or the test result data designated thereto and relay the test pattern data or the test result data designated to the other the test execution modules or the test pattern generating module 200.

For instance, when types of the DUTs to be tested by the test execution modules 300a and 300b differ, the test pattern data may be a unique test pattern data for each of the DUTs, and the unique test pattern data may include the identification information such that the test execution modules 300a and 300b only receives the test pattern data or the test result data unique for each of the test execution modules 300a and 300b.

In addition, when the test for the DUT connected to the test execution module 300a is completed and a next DUT is not loaded, the test execution module 300a may relay the test pattern data or the test result data for the test execution module 300b using the identification information.

Figure 4:
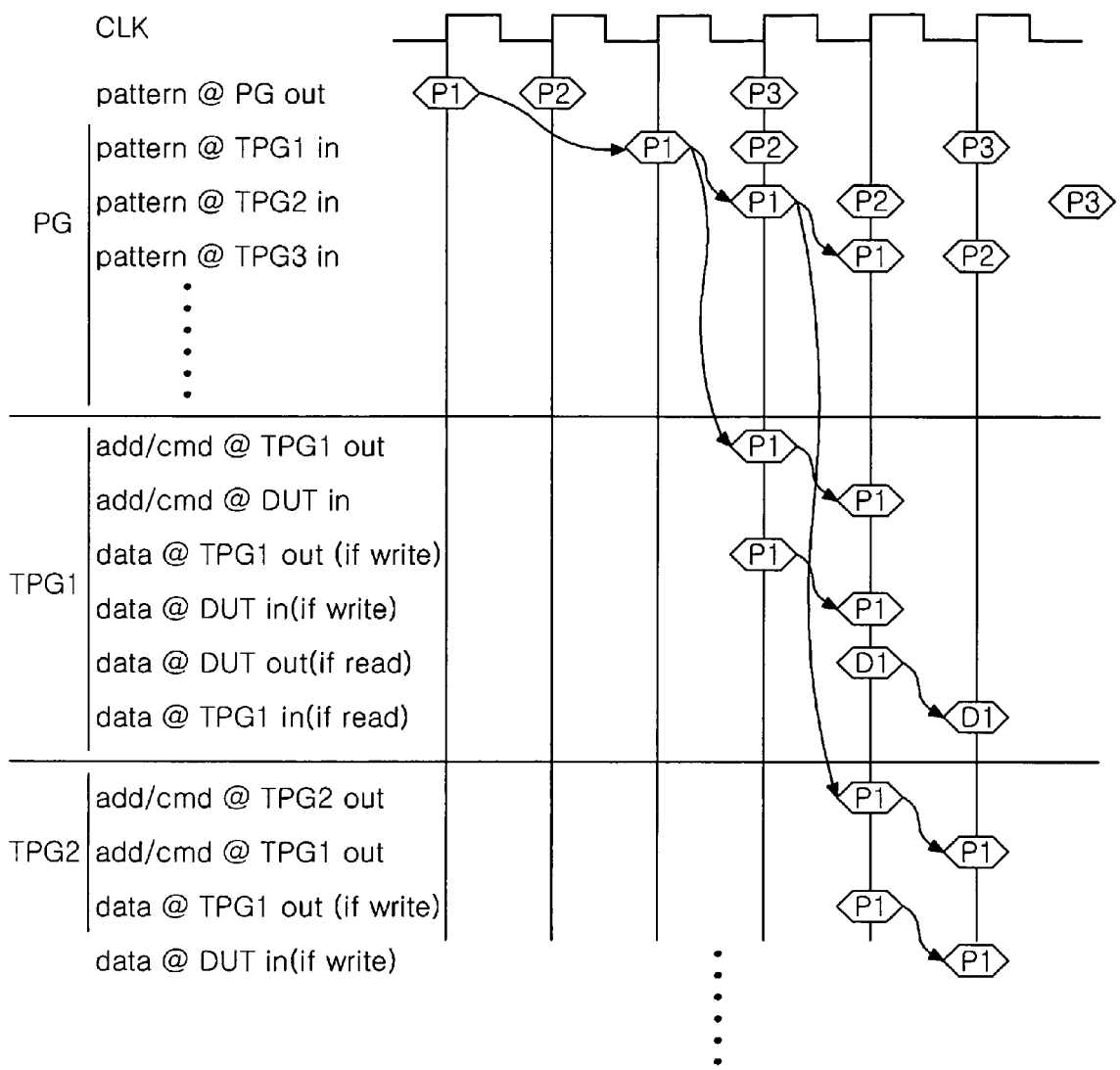
FIG. 4 is a timing diagram illustrating an operation of a sequential semiconductor device tester in accordance with the present invention.

FIG. 4 is a timing diagram illustrating an operation of the sequential semiconductor device tester in accordance with the present invention.

FIG. 4 illustrates an operation between a pattern generating module (denoted as PG), a first test execution module (denoted as TPG1), a second test execution module (denoted as TPG2) and a third test execution module (denoted as TPG3) wherein the pattern generating module and the test execution modules are synchronized to a clock.

The pattern generating module generates and outputs an output signal (denoted as [pattern@PG out]) including test pattern data P1, P2 and P3. The output signal [pattern@PG out] is then sequentially transmitted to the test execution modules TPG1, TPG2 and TPG3 as input signals [pattern@TPG1 in], [pattern@TPG2 in] and [pattern@TPG3 in].

The output signal [pattern@PG out] is inputted to the first test execution module TPG1 as the input signal [pattern@TPG1 in] based on the clock. The output signal [pattern@PG out] is inputted to the second test execution module TPG2 as the input signal [pattern@TPG2 in] based on the clock. The output signal [pattern@PG out] is inputted to the third test execution module TPG3 as the input signal [pattern@TPG3 in] based on the clock.

When the first test execution modules TPG1 receives the output signal [pattern@PG out] as the input signal [pattern@TPG1 in], the first test execution modules TPG1 outputs an address/command signal [add/cmd@TPG1 out]. That is, the first test execution modules TPG1 applies the address/command signal [add/cmd@TPG1 out] to the DUT as an input signal [add/cmd@DUT in]. In addition, when the input signal [pattern@TPG1 in] includes a command signal [data@TPG1 out(if write)] for applying the write data to the DUT, the first test execution modules TPG1 applies the write data to the DUT as an input signal [data@DUT in (if write)].

When the input signal [pattern@TPG1 in] includes a command signal [data@DUT out(if read)] for outputting the result of the test, the first test execution modules TPG1 reads the result of the test as an output signal [data@TPG1 in(if read)].

Each of the operations of the first test execution modules TPG1 is synchronized to the clock. Therefore, the operation is carried out per clock.

The similar applies to the test execution modules TPG2 and TPG3 when the output signal [pattern@PG out] is received.

While the transmission of the output signal [pattern@PG out] of the pattern generating module between the pattern generating module and each of the test execution modules is carried out in two clocks in FIG. 4, the number of clocks required for the transmission may vary.

Moreover, while a latency required for the transmission between the first test execution modules TPG1 and the second test execution modules TPG2, and the second test execution modules TPG2 and the third test execution modules TPG3 is one clock in FIG. 4, the number of clocks required for the transmission may also vary.

As shown in FIG. 4, the test of the DUT corresponding to the second test execution modules TPG2 is carried out one clock after the test of the DUT corresponding to the first test execution modules TPG1 is carried out.

On the other hand, the tester in accordance with the present invention may further comprise one or more DUT module (not shown).

The number of the DUT modules may be same as that of the test execution module.

The DUT module may comprise a DUT loading unit (not shown) for mounting the DUT and a DUT module communication interface (not shown) for carrying out an communication between the DUT loaded in the DUT loading unit and each of the two or more test execution module.

The DUT loading unit receives the write data from the DUT module communication interface and applied the received write data to the DUT loaded therein. The DUT loading unit also receives the result of the test based on the write data from and transmits the result of the test to the DUT module communication interface.

The DUT module communication interface transmits the result of the test received from the DUT loading unit to the test execution modules 300a and 300b and the test execution modules 300a and 300b generates the test result data based on the result of the test.

The DUT loading unit is to mount a semiconductor device component or a semiconductor device module. Preferably, the DUT loading units for loading the semiconductor device component and the semiconductor device module are exchangeable such that the semiconductor device component and the semiconductor device module may be tested without changing a design of the tester.

Figure 5:
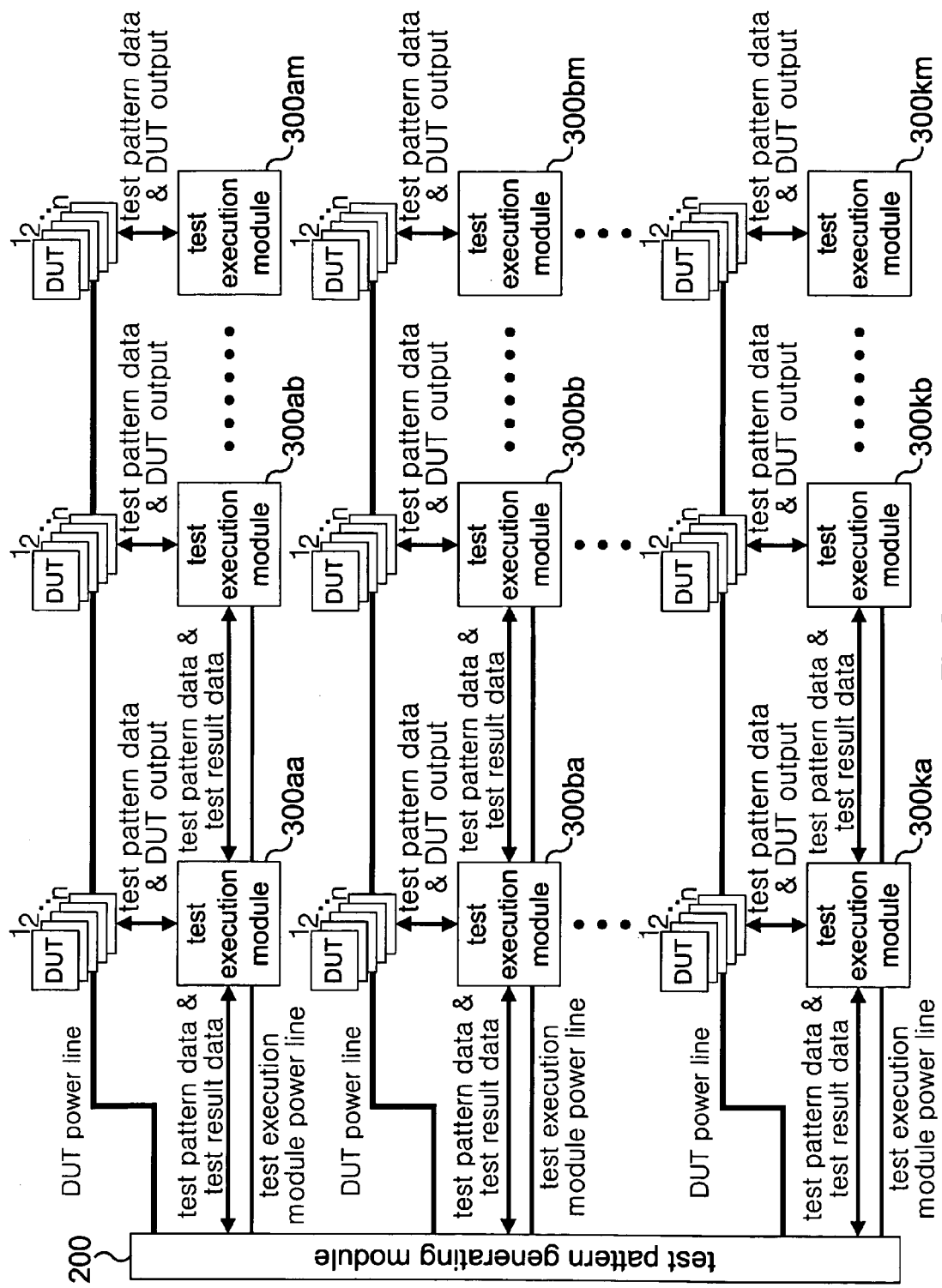
FIG. 5 is a block diagram exemplifying an arrangement of a test execution module of a sequential semiconductor device tester in accordance with the present invention.

FIG. 5 is a block diagram exemplifying an arrangement of the test execution module of the sequential semiconductor device tester in accordance with the present invention.

A plurality of test execution modules 300aa through 300am, 300ba through 300bm and 300ka through 300km may be arranged as shown in FIG. 5. The test execution modules 300aa through 300am are connected in series, the test execution modules 300ba through 300bm are connected in series and the test execution modules 300ka through 300km are connected in series. The test execution modules 300aa, 300ba, ..., 300ka are connected to the pattern generating module 200 in parallel. n number of DUTs are connected to each of the plurality of test execution modules 300aa through 300am, 300ba through 300bm and 300ka through 300km The test pattern data transmitted from the pattern generating module is simultaneously received by the test execution modules 300aa, 300ba, ..., 300ka and the test is then carried out at each of the test execution modules 300aa, 300ba, ..., 300ka.

Thereafter, when the test pattern data is transmitted from the test execution modules 300aa, 300ba, ..., 300ka to the test execution modules 300ab, 300bb, ..., 300kb, the test is carried out at each of the test execution modules 300ab, 300bb, ..., 300kb.

Similarly, the test is carried out in parallel and sequentially to test n×k×m number of DUTs. Therefore, the number of DUTs tested based on the single test pattern data is drastically increased.

That is, since the test execution modules 300aa through 300am, 300ba through 300bm and 300ka through 300km that are connected sequentially operate synchronously, the signal integrity of the test pattern data provided to the DUTs is always maintained even when the DUTs are connected in the daisy chain.

In addition, when the test pattern generating module 200 comprises the synchronization buffer for instance, the signal integrity of the test pattern data provided to the test execution modules 300aa, 300ba, ..., 300ka connected in parallel is maintained.

On the other hand, in accordance with one example of the present invention, a power line for providing a power to the test execution modules 300aa through 300am, 300ba through 300bm and 300ka through 300km or the DUTs may be disposed.

Figure 6A:
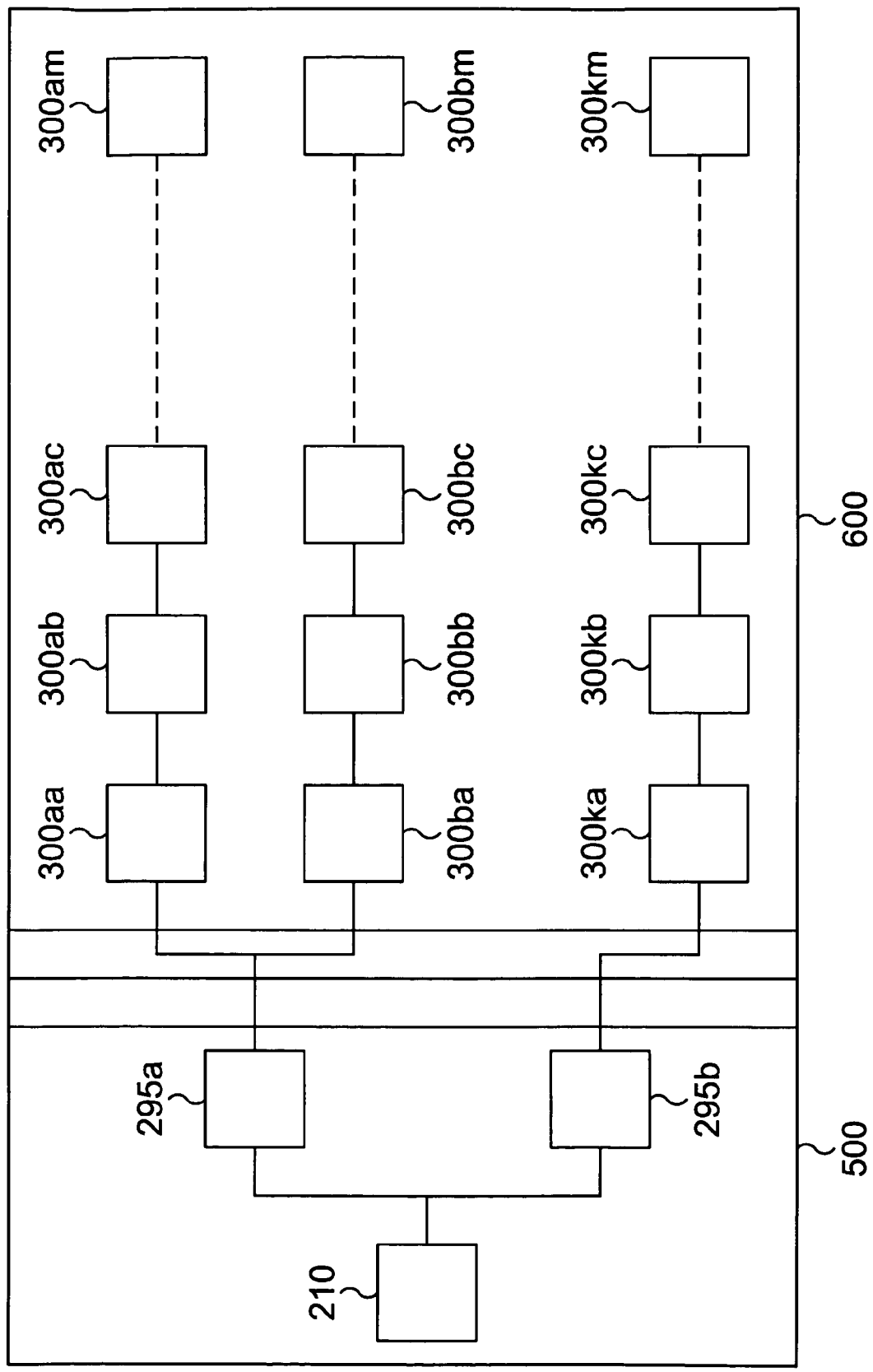
FIGS. 6a and 6b are block diagrams exemplifying an actual embodiment of a sequential semiconductor device tester in accordance with the present invention.
Figure 6B:
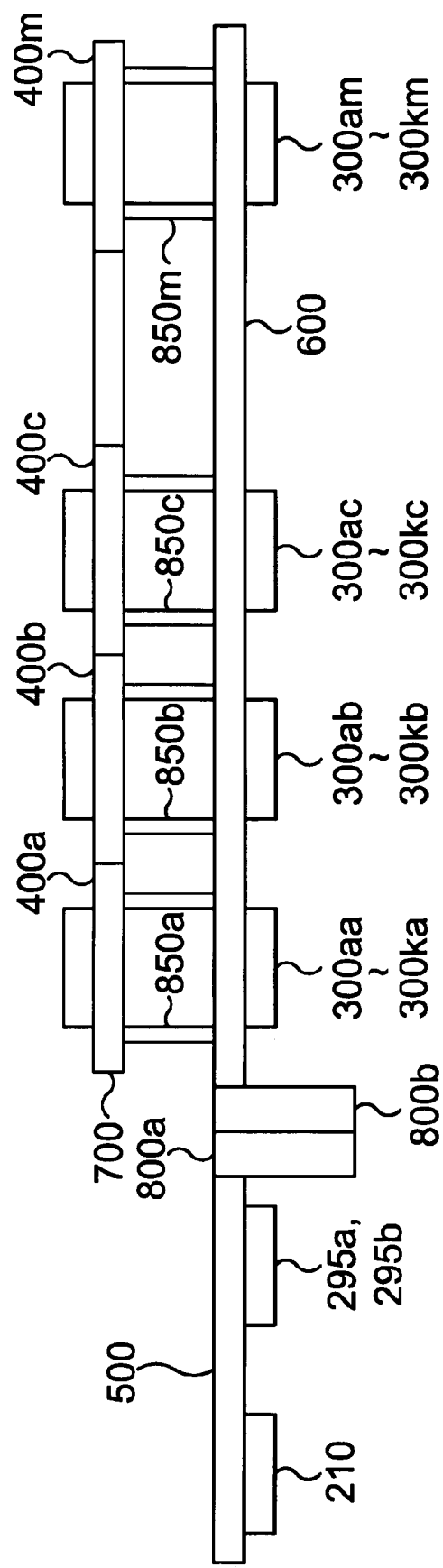

FIGS. 6a and 6b are block diagrams exemplifying an actual embodiment of the sequential semiconductor device tester in accordance with the present invention.

FIGS. 6a and 6b illustrate the sequential semiconductor device tester wherein the test pattern generating module including the test pattern data generator 210 and the synchronization buffers 295a and 295b are embodied to be accommodated in a single test pattern generating board 500, and the test execution modules 300aa through 300am, 300ba through 300bm and 300ka through 300km are embodied to be accommodated in a single test execution board 600.

Referring to FIGS. 6a and 6b, the test pattern data generator 210, the synchronization buffers 295a and 295b or the test execution modules 300aa through 300am, 300ba through 300bm and 300ka through 300km may be embodied as a single chip as shown.

The single test pattern generating board 500 and the single test execution board 600 are connected to each other via first connectors 800a and 800b. The single test pattern generating board 500 and the single test execution board 600 are detachable from each other by employing the first connectors 800a and 800b in a docking form.

FIG. 6b illustrates a lateral view of the sequential semiconductor device tester shown in FIG. 6a, wherein a single DUT board 700 is mounted on the single test execution board 600.

While the DUT module may be embodied as the single DUT board 700 to correspond to the single test execution board 600, the plurality of DUT boards the number of which corresponds to that of DUT modules 400a through 400m may be used such that each of the plurality of DUT boards corresponds to the test execution modules 300aa through 300am, 300ba through 300bm and 300ka through 300km.

In such case, the single DUT board 700 and the single DUT board 700 may be connected through second connectors 850a through 850m corresponding to the test execution modules 300aa through 300am, 300ba through 300bm and 300ka through 300km and the DUT modules 400a through 400m As described above, in accordance with the present invention, the function of generating the test pattern data for the test of the semiconductor device and the function of carrying out the test are separated to sequentially test the semiconductor device, the signal integrity is maintained and the efficiency of the test is improved by carrying out the application environment test or the ATE test according to the test pattern data.

What is claimed is:

1. A sequential semiconductor device tester comprising:
   a test pattern generating module for generating test pattern data; and
   a set of m test execution modules including first through $m^{th}$ test execution modules connected in series, wherein the test pattern data is received by the first test execution module from test pattern generating module and the test pattern data is then sequentially relayed to the second through $m^{th}$ test execution modules connected in series to test a set of n DUTs connected to each of the first through $m^{th}$ test execution modules and generate test result data for each of the set of n DUTs.

2. The tester in accordance with claim 1, wherein the test pattern generating module comprises:
   a test pattern data generator for generating the test pattern data; and
   a test pattern generating module communication interface for transmitting the test pattern data to the first test execution module and for receiving the test result data from each of the set of m test execution modules.

3. The tester in accordance with claim 1, wherein the each of the set of m test execution modules comprises:
   a test execution module communication interface for transceiving the test pattern data and the test result data; and
   a test execution unit for applying the test pattern data received through the test execution module communication interface to the DUT and receiving an output of the DUT corresponding to the test pattern data from the DUT to generate the test result data.

4. The tester in accordance with claim 1, wherein the test pattern generating module or the first through $m^{th}$ test execution modules transmits the test result data to an external apparatus.

5. The tester in accordance with claim 1, wherein the test pattern data or the test result data comprises control data for controlling each of the first through $m^{th}$ test execution modules.

6. The tester in accordance with claim 5, wherein the control data comprises an identification information of each of the first through $m^{th}$ test execution modules.

7. The tester in accordance with claim 6, wherein each of the first through $m^{th}$ test execution modules relays the test pattern data and the test result data to other test execution modules based on the identification information except the test pattern data or the test result data designated thereto.

8. The tester in accordance with claim 2, wherein the test pattern generating module communication interface receives a test pattern program for generating the test pattern data from an external apparatus.

9. The tester in accordance with claim 2, wherein the test pattern generating module communication interface receives a test pattern of an application environment for generating the test pattern data from an external apparatus, and wherein the test pattern data generator generates the test pattern data based on the test pattern of the application environment.

10. The tester in accordance with claim 2, wherein the test pattern data generator generates the test pattern data based on a test pattern of an application environment stored therein.

11. The tester in accordance with claim 2, wherein the test pattern generating module further comprises a synchronization buffer for transceiving the test pattern data and the test result data with a plurality of the first test execution modules synchronously.

12. The tester in accordance with claim 1, wherein the test pattern data comprises a control command for testing the DUT, a clock signal, write data to be written to the DUT and expected data for the test result data.

13. The tester in accordance with claim 12, wherein each of the set of m test execution modules comprises a test execution unit for applying the test pattern data to the DUT and receiving an output of the DUT corresponding to the test pattern data from the DUT to generate the test result data, the test execution unit comprising:
   a clock generator for generating a synchronous clock based on the clock signal;
   a control command interpreter for interpreting the control command based on the synchronous clock to be applied to the DUT;
   a driver for applying the write data to the DUT based on the control command and the synchronous clock; a comparator for comparing the test result data to the expected data to determine a defectiveness of the DUT; and
   a test result storage for storing a result of the determination of the comparator.

14. The tester in accordance with claim 1, wherein the test pattern generating module is accommodated in a single test pattern generating board and the first through $m^{th}$ test execution modules are accommodated in a single test execution board, the single test pattern generating board and the single test execution board are connected to each other via a connector.

* * * * *